(12) United States Patent
Weinmann et al.

(10) Patent No.: US 11,372,047 B2
(45) Date of Patent: Jun. 28, 2022

(54) METHOD FOR DETECTING AN INSULATION FAULT IN A MOTOR ARRANGEMENT, METHOD FOR DETECTING A MOTOR PHASE INTERRUPTION IN A MOTOR ARRANGEMENT, AND DRIVE CIRCUIT FOR DRIVING AN ELECTRONICALLY COMMUTATED MOTOR

(71) Applicant: DIEHL AKO STIFTUNG & CO. KG, Wangen (DE)

(72) Inventors: Martin Weinmann, Bad Waldsee (DE); Andreas Schmid, Wangen im Allgaeu (DE); Sebastian Tinius, Lauf (DE)

(73) Assignee: Diehl AKO Stiftung & Co. KG, Wangen (DE)

( * ) Notice: Subject to any disclaimer, the term of this patent is extended or adjusted under 35 U.S.C. 154(b) by 298 days.

(21) Appl. No.: 16/537,810

(22) Filed: Aug. 12, 2019

(65) Prior Publication Data

US 2020/0049769 A1 Feb. 13, 2020

(30) Foreign Application Priority Data

Aug. 11, 2018 (DE) ...................... 10 2018 006 382.9

(51) Int. Cl.
*G01R 31/34* (2020.01)
*G01R 31/12* (2020.01)
(Continued)

(52) U.S. Cl.
CPC ....... *G01R 31/343* (2013.01); *G01R 31/1272* (2013.01); *G01R 31/14* (2013.01);
(Continued)

(58) Field of Classification Search
None
See application file for complete search history.

(56) References Cited

U.S. PATENT DOCUMENTS 6,043,664 A 3/2000 Kliman et al.
2006/0158197 A1* 7/2006 Horikoshi ............ G01R 31/343
324/551

(Continued)

FOREIGN PATENT DOCUMENTS

DE 112014002853 T5 3/2016
EP 1681575 A1 7/2006

OTHER PUBLICATIONS

Grubic S. et al.: "A Survey of Testing and Monitoring Methods for Stator Insulation Systems in Induction Machines" 2008 International Conference on Condition Monitoring and Diagnosis, Beijing, China, Apr. 21-24, 2008.

*Primary Examiner* — Jermele M Hollington
*Assistant Examiner* — Suresh K Rajaputra
(74) *Attorney, Agent, or Firm* — Laurence A. Greenberg; Werner H. Sterner; Ralph E. Locher

(57) ABSTRACT

A drive circuit for driving an electronically commutated motor contains a DC voltage intermediate circuit, and an inverter which is connected to the latter and has a bridge circuit containing a plurality of transistors, to which the motor phases of a motor configuration containing the motor can be connected. For detecting an insulation fault in the motor configuration, a positive or negative transistor of the inverter is switched on, while all other transistors of the inverter are switched off before all transistors of the inverter are switched off. A motor phase voltage of a selected motor phase of the motor phases with respect to a reference potential is then captured, while all transistors of the inverter remain switched off in order to determine whether there is an insulation fault on the motor phase on a basis of a voltage profile of the motor phase voltage.

14 Claims, 6 Drawing Sheets

(51) Int. Cl.
  *G01R 31/14* (2006.01)
  *H02H 7/09* (2006.01)
  *H02H 7/08* (2006.01)
  *H02P 6/14* (2016.01)

(52) U.S. Cl.
  CPC ............ *H02H 7/0833* (2013.01); *H02H 7/09* (2013.01); *H02P 6/14* (2013.01)

(56) References Cited

U.S. PATENT DOCUMENTS

2009/0195205 A1* 8/2009 Ide .................. G01R 31/346
                                                    318/490
2018/0340971 A1* 11/2018 Tamida ................ G01R 31/52

* cited by examiner

METHOD FOR DETECTING AN INSULATION FAULT IN A MOTOR ARRANGEMENT, METHOD FOR DETECTING A MOTOR PHASE INTERRUPTION IN A MOTOR ARRANGEMENT, AND DRIVE CIRCUIT FOR DRIVING AN ELECTRONICALLY COMMUTATED MOTOR

CROSS-REFERENCE TO RELATED APPLICATION

The application claims the priority, under 35 U.S.C. § 119, of German application DE 10 2018 006 382.9, filed Aug. 11, 2018; the prior application is herewith incorporated by reference in its entirety.

BACKGROUND OF THE INVENTION

Field of the Invention

The present invention relates to a method for detecting an insulation fault in a motor arrangement, to a method for detecting a motor phase interruption in a motor arrangement, and to a drive circuit for driving an electronically commutated motor.

When operating an electronically commutated motor using a drive circuit, various insulation faults may arise on the side of the motor. These insulation faults include insulation faults of the motor phases which may arise, for example, as a result of a defect in the motor cable or the motor winding. In addition, an insulation fault may arise at a motor neutral point as a result of insulation faults of the motor windings. In the case of an insulation fault, an electrical current can flow away to earth or the protective conductor, in which case such a fault current may constitute a risk to persons as a result of electrical shock and a fire risk. There is therefore a general attempt to reliably detect insulation faults or fault currents in order to prevent further operation of a drive circuit for an electronically commutated motor, for example.

U.S. Pat. No. 6,043,664 A discloses a method and an apparatus for detecting insulation faults in a multi-phase AC motor, in which the voltages of all motor phases with respect to the protective conductor are measured and summed in order to detect the presence of an insulation fault from a comparison of the voltage sum averaged over time with a predefined threshold value.

Furthermore, motor phase interruptions may also arise in motor arrangements, for example as a result of severed motor cables or burnt-out motor windings. There is a general attempt to also reliably detect such motor phase interruptions in order to prevent further operation of a drive circuit for an electronically commutated motor, for example.

SUMMARY OF THE INVENTION

The object of the invention is to provide an improved method for detecting an insulation fault or a motor phase interruption in a motor arrangement, the motor phases of which are connected to a drive circuit.

This object is achieved by the teaching in the independent claims. The dependent claims relate to particularly advantageous configurations and developments of the invention.

The method according to the invention detects an insulation fault in a motor arrangement. The motor phases of which are connected to a drive circuit, and the drive circuit has a DC voltage intermediate circuit and an inverter with a bridge circuit having at least one positive circuit breaker and at least one negative circuit breaker. The method contains the steps of: switching on at least one positive or negative circuit breaker of the inverter, while all other circuit breakers of the inverter are switched off; switching off all circuit breakers of the inverter; capturing at least one motor phase voltage of a selected motor phase of the motor phases with respect to a reference potential, while all circuit breakers of the inverter remain switched off; and determining whether there is an insulation fault on one of the motor phases of the motor arrangement on the basis of a voltage profile of the captured motor phase voltage.

The method according to the invention detects a motor phase interruption in a motor arrangement. The motor phases of which are connected to a drive circuit and the drive circuit has a DC voltage intermediate circuit and an inverter with a bridge circuit having at least one positive circuit breaker and at least one negative circuit breaker. The method contains the steps of: switching on at least one positive or negative circuit breaker, preferably all positive or negative circuit breakers of the inverter individually in succession, while all other circuit breakers of the inverter are switched off; capturing at least one motor phase voltage of a selected motor phase of the motor phases with respect to a reference potential; and determining whether there is a motor phase interruption in one of the motor phases of the motor arrangement on the basis of a voltage profile of the captured motor phase voltage.

Both fault detection methods of the invention are based on the knowledge that, as a result of a motor being connected to a drive circuit, parasitic capacitances of the motor or of the motor cable are also coupled with respect to the protective conductor, and that, on the other hand, the drive circuit is also connected to the potential of the protective conductor via capacitances or a network connection. These parasitic capacitances are charged in a low-impedance manner and therefore also very quickly by switching on at least one positive circuit breaker of the inverter in the positive half-wave of the network voltage, while all other circuit breakers of the inverter are switched off. In a similar manner, these parasitic capacitances are discharged in a low-impedance manner and therefore also very quickly by switching on at least one negative circuit breaker of the inverter in the negative half-wave of the network voltage, while all other circuit breakers of the inverter are switched off.

These parasitic capacitances are then discharged when the inverter is switched off (positive half-wave of the network voltage) and these parasitic capacitances are charged (negative half-wave of the network voltage). If there is insulation fault on the motor phases, the parasitic capacitances are also discharged via this insulation fault resistance (positive half-wave of the network voltage) and these parasitic capacitances are also charged via this insulation fault resistance (negative half-wave of the network voltage), with the result that the discharging curve and the charging curve of the parasitic capacitances and therefore also the voltage profile of an arbitrary motor phase voltage change accordingly. The discharging and charging of the parasitic capacitances are accelerated, in particular, via fault currents on account of insulation faults. It is therefore possible to detect, on the basis of the voltage profile of the captured motor phase voltage, whether there is an insulation fault on one of the motor phases. This insulation fault detection can therefore be carried out with a simple and cost-effective circuit structure and simple measurement signal evaluation.

In contrast, if there is an interruption in a motor phase, for example on account of a severed motor cable, a defective motor cable, an incorrectly connected motor cable or a burnt-out motor winding of the motor, the voltage of the selected motor phase does not assume the intermediate circuit voltage if the positive circuit breaker belonging to the interrupted motor phase is switched on in the positive half-wave of the network voltage and does not assume zero volts if the negative circuit breaker belonging to the interrupted motor phase is switched on in the negative half-wave of the network voltage. It is therefore possible to detect, on the basis of the voltage profile of the captured motor phase voltage, whether there is a motor phase interruption in the respective motor phase when a positive or negative circuit breaker of the inverter is switched on. All positive or negative circuit breakers of the inverter are preferably individually switched on in succession in order to check all motor phases for a motor phase interruption. This motor phase interruption detection can therefore be carried out with a simple and cost-effective circuit structure and simple measurement signal evaluation.

In the event of a detected insulation fault or a detected motor phase interruption, subsequently planned control of the motor can be prevented/terminated and/or a fault signal can be generated, for example. In embodiments in which the drive circuit also contains a power factor correction filter (PFC filter), this filter is then preferably no longer activated in the event of a detected insulation fault or a detected motor phase interruption.

Since the motor is not actively energized during the insulation fault detection on account of the switched-off inverter of the drive circuit, all motor phases are at the same potential with respect to earth. It is therefore sufficient to evaluate only one motor phase voltage of a selected motor phase of the motor phases in order to also be able to detect insulation faults on the other motor phases or at the neutral point of the motor windings. In order to ensure this effect to an even better extent, the one motor phase voltage is preferably captured while the motor is at a standstill, with the result that no voltages which could influence the one motor phase voltage can be induced by a rotor of the motor which is still rotating. However, within the scope of the invention, a plurality of motor phase voltages of selected motor phases could also be optionally captured.

The motor arrangement contains, in particular, a motor and a motor cable for connecting the motor to a drive circuit. The detectable insulation faults on the motor phases include, in particular, insulation faults on the motor phases of the motor cable, in the motor windings and at a neutral point of the motor windings.

The invention is not restricted to a special type of motor. The motor in the motor arrangement is, in particular, an electronically commutated motor, for example a synchronous motor or an asynchronous motor, an AC motor, a three-phase motor or the like.

The inverter of the drive circuit preferably has an inverter bridge circuit, preferably having a plurality of circuit breakers (for example MOSFETs or IGBTs having diodes with an antiparallel connection). The inverter preferably has a multi-phase configuration in a manner corresponding to the connected motor. A positive circuit breaker of the inverter is understood as meaning a circuit breaker which is connected to the positive pole of the DC voltage intermediate circuit and is often also referred to as a high-side switch. During a positive half-wave of the network voltage, at least one positive circuit breaker is closed in order to charge the parasitic capacitances. A negative circuit breaker of the inverter is understood as meaning a circuit breaker which is connected to the negative pole of the DC voltage intermediate circuit and is often also referred to as a low-side switch. During a negative half-wave of the network voltage, at least one negative circuit breaker is closed in order to discharge the parasitic capacitances.

The DC voltage intermediate circuit of the drive circuit preferably has an intermediate circuit capacitor. The DC voltage intermediate circuit of the drive circuit is preferably connected, via a rectifier, to an AC connection, to which the respective supply network can be connected. The rectifier of the drive circuit is preferably in the form of a bridge rectifier having a plurality of rectifier diodes.

The reference potential is, for example, the negative pole of the DC voltage intermediate circuit or earth.

In one configuration of the invention, the selected motor phase is connected to the reference potential via a high impedance measuring, and an accordingly divided motor phase voltage of the selected motor phase is captured. In this context, a high impedance measuring is intended to be understood as meaning a resistance value of several 100 kilohms and more. The resistance value of the high impedance measuring is 10 megohms, for example. In comparison, a critical insulation fault of the motor phases with respect to the protective conductor has resistance value of less than several 10 kilohms. The charging or discharging of the parasitic capacitances between the motor phases and the protective conductor is carried out via the high impedance measuring while the inverter is switched off and additionally via corresponding fault currents in the event of insulation faults. The more critical the insulation faults, that is to say the higher the fault currents, the faster the voltage transient at the measuring impedance.

In one configuration of the invention, the motor phase voltage or the divided motor phase voltage is captured by a voltage divider. The voltage divider preferably simultaneously forms the high impedance measuring. The measurement voltage measured by a voltage divider can advantageously be evaluated by an analogue/digital converter, for example of a microcontroller.

If the drive circuit also has a power factor correction filter (PFC filter) with a switch between the rectifier and the DC voltage intermediate circuit, the switch of this PFC filter is preferably switched off, before switching on at least one positive or negative transistor of the inverter, in order to exclude possible DC faults which could impair, for example, a type A residual current device (RCD).

In one configuration of the invention, the at least one transistor of the inverter is switched on only for a very short period of a few microseconds, for example, during the charging operation or discharging operation. In this short time, a fault current on account of an existing insulation fault does not yet result in the tripping of an external fuse, for example a RCD. Such a short acting time is also less critical with respect to the physiological effect in the case of a fault current via a body.

The drive circuit according to the invention for driving an electronically commutated motor has a DC voltage intermediate circuit, and an inverter which is connected to the DC voltage intermediate circuit and has a bridge circuit having at least one positive transistor and at least one negative transistor, to which the motor phases of a motor arrangement containing the motor can be connected. The drive circuit according to the invention also contains a detection circuit for capturing at least one motor phase voltage of a selected motor phase of the motor phases with respect to a reference potential, and a control device which is configured to individually switch the transistors of the inverter on and off and to operate the detection circuit for capturing the motor phase voltage. According to a first aspect of the invention, the control device is also configured to determine, on the basis of a voltage profile of the captured motor phase voltage, whether there is an insulation fault on one of the motor phases of the motor arrangement. According to a second aspect of the invention, the control device is also configured to determine, on the basis of a voltage profile of the captured motor phase voltage, whether there is a motor phase interruption in one of the motor phases of the motor arrangement. The first aspect and the second aspect can preferably also both be provided.

This drive circuit can be used to achieve the same advantages as those achieved with the two above-described methods for detecting an insulation fault and a motor phase interruption. With respect to the advantageous configurations and definition of terms, reference is likewise additionally made to the above statements in connection with the methods.

In one configuration of the invention, the detection circuit has a high impedance measuring via which the selected motor phase is connected to the reference potential.

In one configuration of the invention, the detection circuit has a voltage divider for capturing the motor phase voltage.

In one configuration of the invention, the drive circuit also has at least one additional capacitor which is connected to earth from one of the motor phases. Since the magnitude of the parasitic capacitances of the motor or of the motor cable with respect to the protective conductor is greatly dependent on the application, the parasitic capacitances can be increased, in motor structures of particularly low capacitance (for example short motor cable, low-capacitance motor), by means of additional capacitors in the drive circuit which are each connected to earth from a motor phase. The described principle of fault current detection on the motor side can therefore also be used in applications with low-capacitance motor arrangements.

In a further configuration of the invention, the DC voltage intermediate circuit is connected to an AC connection on the input side via a rectifier, and a power factor correction filter (PFC filter) with a switch is also provided between the rectifier and the DC voltage intermediate circuit. In this case, the control device is preferably configured to switch off the switch of the PFC filter before switching on at least one positive or negative transistor of the inverter.

In a further configuration of the invention, the control device is also configured to prevent switching-on of the inverter and/or of the power factor correction filter (if present) after capturing the motor phase voltage if an insulation fault or a motor phase interruption has been determined.

Other features which are considered as characteristic for the invention are set forth in the appended claims.

Although the invention is illustrated and described herein as embodied in a method for detecting an insulation fault in a motor arrangement, a method for detecting a motor phase interruption in a motor arrangement, and a drive circuit for driving an electronically commutated motor, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DETAILED DESCRIPTION OF THE INVENTION

Figure 1:
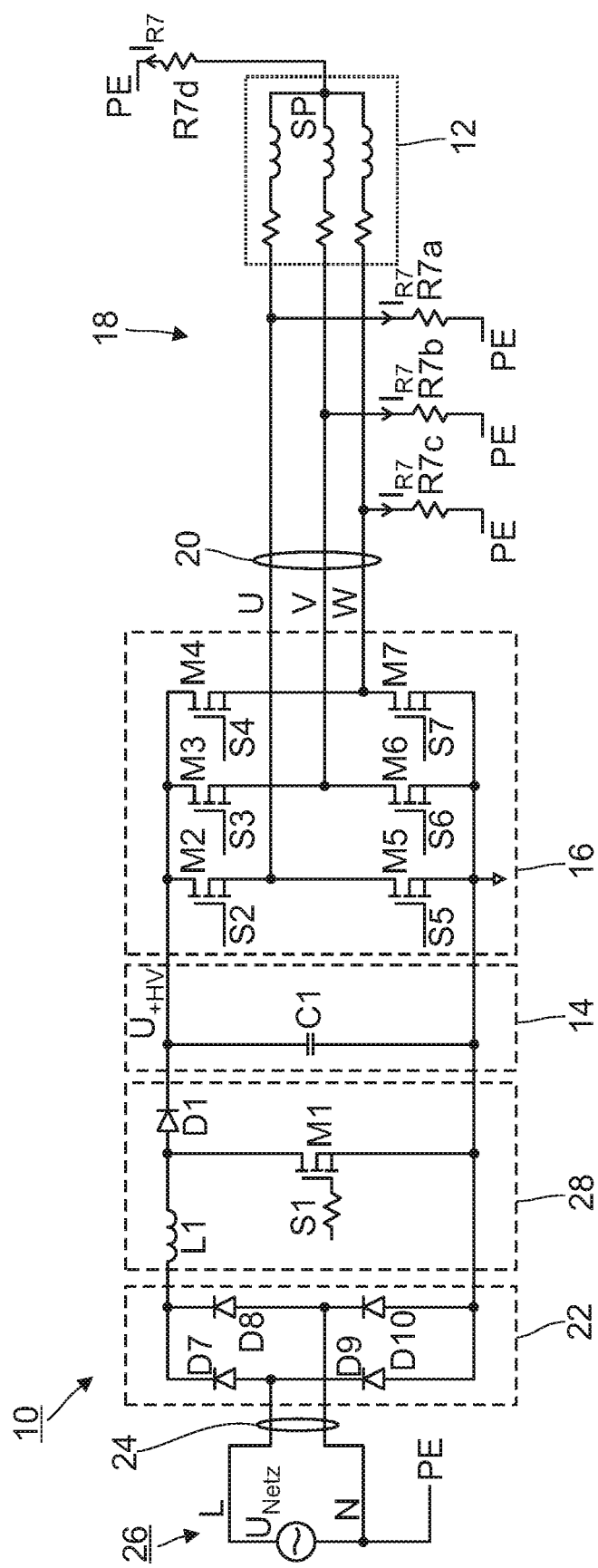
FIG. 1 is a circuit diagram of a drive circuit with a connected motor and various possible insulation faults on the motor phases.

Referring now to the figures of the drawings in detail and first, particularly to FIG. 1 thereof, there is shown a drive circuit 10 is used to drive an electronically commutated motor 12. In the example from FIG. 1, the motor is a three-phase brushless motor 12 having three motor phases U, V, W which are connected to one another at a neutral point SP. The motor 12 is fed from a DC voltage intermediate circuit 14 via an inverter 16. The DC voltage intermediate circuit 14 has an intermediate circuit capacitor C1, and the inverter 16 has a three-phase inverter bridge circuit in this exemplary embodiment having a total of six transistors M2 to M7 (for example MOSFETs or IGBTs having diodes with an antiparallel connection) in its half-bridges. The three motor windings of the motor 12 are connected, via a motor cable 18, to a motor phase connection 20 which is connected to the three center taps of the half-bridges of the inverter 16. The motor 12 and the motor cable 18 each have three motor phases U, V, W and are parts of the motor arrangement.

On the input side, the DC voltage intermediate circuit 14 is connected to an AC connection 24 via a rectifier 22. The drive circuit 10 can be connected to a supply network 26 via the AC connection 24. In the example from FIG. 1, the supply network 26 is a single-phase power supply system, the drive circuit 10 is connected to the phase conductor L and to the neutral conductor N of the single-phase power supply system, and the supply network 26 also has protective earthing PE. In this example, the rectifier 22 has a rectifier bridge circuit with a total of four rectifier diodes D7 to D10.

Optionally, a power factor correction filter (PFC filter) 28 can also be connected between the rectifier 22 and the DC voltage intermediate circuit 14. The PFC filter 28 is configured in a boost converter topology in this example and contains, in particular, an inductance L1, a switch M1 and a rectifier diode D1.

The drive circuit 10 also has a control device (not illustrated in FIG. 1), for example in the form of a microcontroller, which controls the switch M1 of the PFC filter 28, if present, and the transistors M2 to M7 of the inverter 16 using appropriate control signals S1 and S2 . . . 7.

In the case of such a drive circuit 10, there are various types of insulation faults which can occur on the side of the connected motor 12. Insulation faults of the motor phases U, V, W in the motor cable 18 and insulation faults of the neutral point SP of the motor windings of the motor 12 may arise. The various types of insulation faults are illustrated in FIG. 1 as insulation faults with the resistors R7a, R7b, R7c for the motor phases U, V, W of the motor capable 12 and with the resistor R7d for the neutral point SP of the motor windings of the motor 12.

Figure 2:
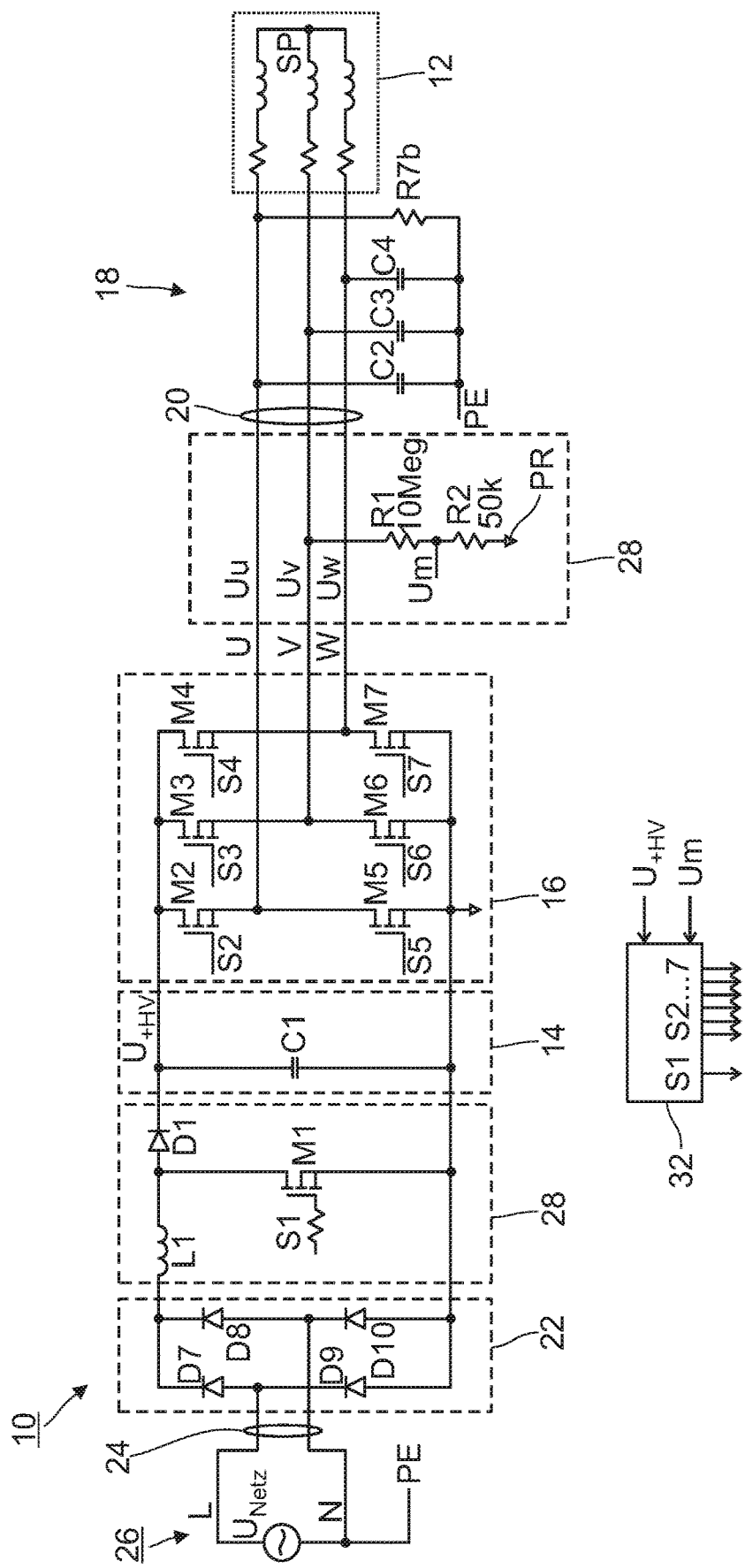
FIG. 2 is a circuit diagram of the drive circuit with the connected motor according to one exemplary embodiment of the invention.

Referring to FIG. 2, the structure and method of operation of a drive circuit for an electronically commutated motor according to one exemplary embodiment of the invention are now explained in more detail. In this case, identical or corresponding components are denoted using the same reference numerals as in FIG. 1.

The drive circuit 10 from FIG. 2 corresponds substantially to the drive circuit from FIG. 1. In addition to the rectifier 22, optional PFC filter 28, DC voltage intermediate circuit 14 and inverter 16, the drive circuit 10 according to the invention contains a detection circuit 30 which can be used to detect all above-described insulation faults on the motor phases of the motor arrangement.

The detection circuit 30 contains a high impedance measuring which is formed by a first resistor R1 and via which a selected motor phase (here: V) of the motor phases U, V, W is connected to a reference potential PR. The reference potential PR is, for example, the negative pole of the DC voltage intermediate circuit 14 or earth. The first resistor R1 has a resistance value of 10 megohms, for example.

The detection circuit 30 also has a voltage divider which is formed by the first resistor R1 and a second resistor R2 which are connected in series between the motor phase V and the reference potential PR. The second resistor R2 has a resistance value of 50 kilohms, for example. This voltage divider R1, R2 can be used to capture, as the measurement voltage Um, a divided voltage of the motor phase voltage Uv which can then be evaluated by an analogue/digital converter of the control device 32.

In the exemplary embodiment from FIG. 2, the detection circuit 30 captures the divided motor phase voltage Um of the motor phase V. In other embodiments of the invention, divided motor phase voltages Um of the other motor phases U, W or divided motor phase voltages Um of a plurality of motor phases U, V, W can also be captured in a similar manner.

FIG. 2 also depicts the parasitic capacitances C2, C3, C4 between the motor phases U, V, W and the protective earthing PE and, for example, an insulation fault resistance R7b of the motor phase V with respect to the protective earthing PE.

Insulation fault detection on the motor phases U, V, W of the motor arrangement 12, 18 is carried out as follows.

During the positive half-wave of the network voltage $U_{Netz}$, the control device 32 first of all uses appropriate control signals S2 . . . 7 to switch on at least one of the three positive transistors (high-side switches) M2, M3, M4 of the inverter 16, while the three negative transistors (low-side switches) M5, M6, M7 remain permanently switched off. In a similar manner, during the negative half-wave of the network voltage $U_{Netz}$, the control device 32 uses appropriate control signals S2 . . . 7 to switch on at least one of the negative transistors (low-side switches) M5, M6, M7, while the three positive transistors (high-side switches) M2, M3, M4 remain permanently switched off. As a result, the parasitic capacitances C2, C3, C4 are first of all charged to the intermediate circuit voltage $U_{+HV}$ (positive half-wave of the network voltage) or discharged (negative half-wave of the network voltage).

If the fault current detection is used in a drive circuit 10 with an active PFC filter 28, this active PFC filter 28 is preferably switched off by the control device 32 using an appropriate control signal S1 during the charging operation in order to prevent possible DC faults since these DC faults could impair the function of a type A RCD.

Figure 3:
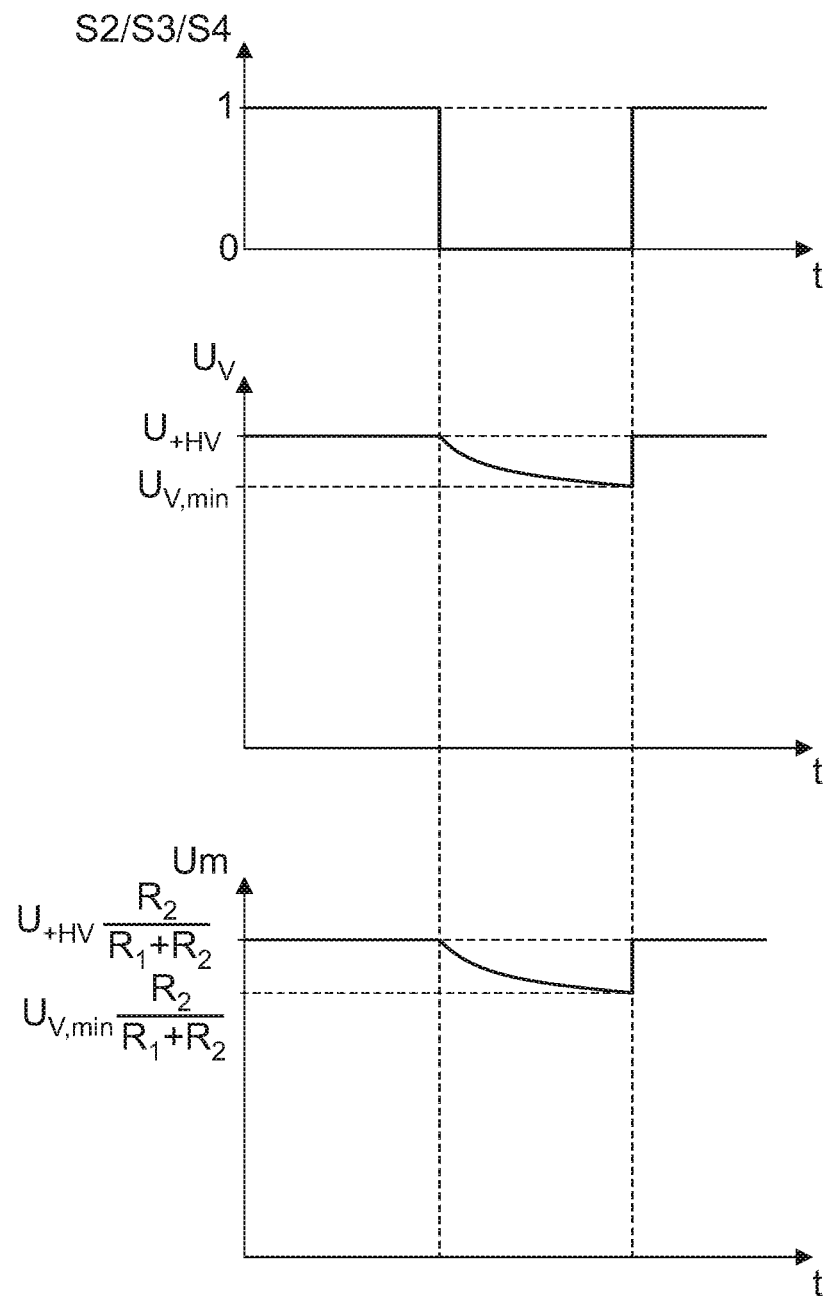
FIG. 3 is an illustration of graphs showing control signals of an inverter, a motor phase voltage and a captured divided motor phase voltage of an insulation fault detection for the drive circuit from FIG. 2 during a positive half-wave of a network voltage in a fault-free case without insulation faults.

FIG. 3 shows the curve profiles of the control signals S2 . . . 4 of the inverter 16, the motor phase voltage Uv and the captured divided motor phase voltage Um during the insulation fault detection for the fault-free case during the positive half-wave of the network voltage $U_{Netz}$.

After the charging operation, all transistors M2 to M7 are switched off by the control device 32. In the fault-free case, the parasitic capacitances C2, C3, C4 are then discharged via the high-impedance voltage divider R1, R2 of the detection circuit 30. As a result of the high RC time constant on account of the high impedance discharge resistor, the voltage on the motor phase V falls only slowly during the time in which the transistors M2, M3, M4 are also switched off.

Figure 4:
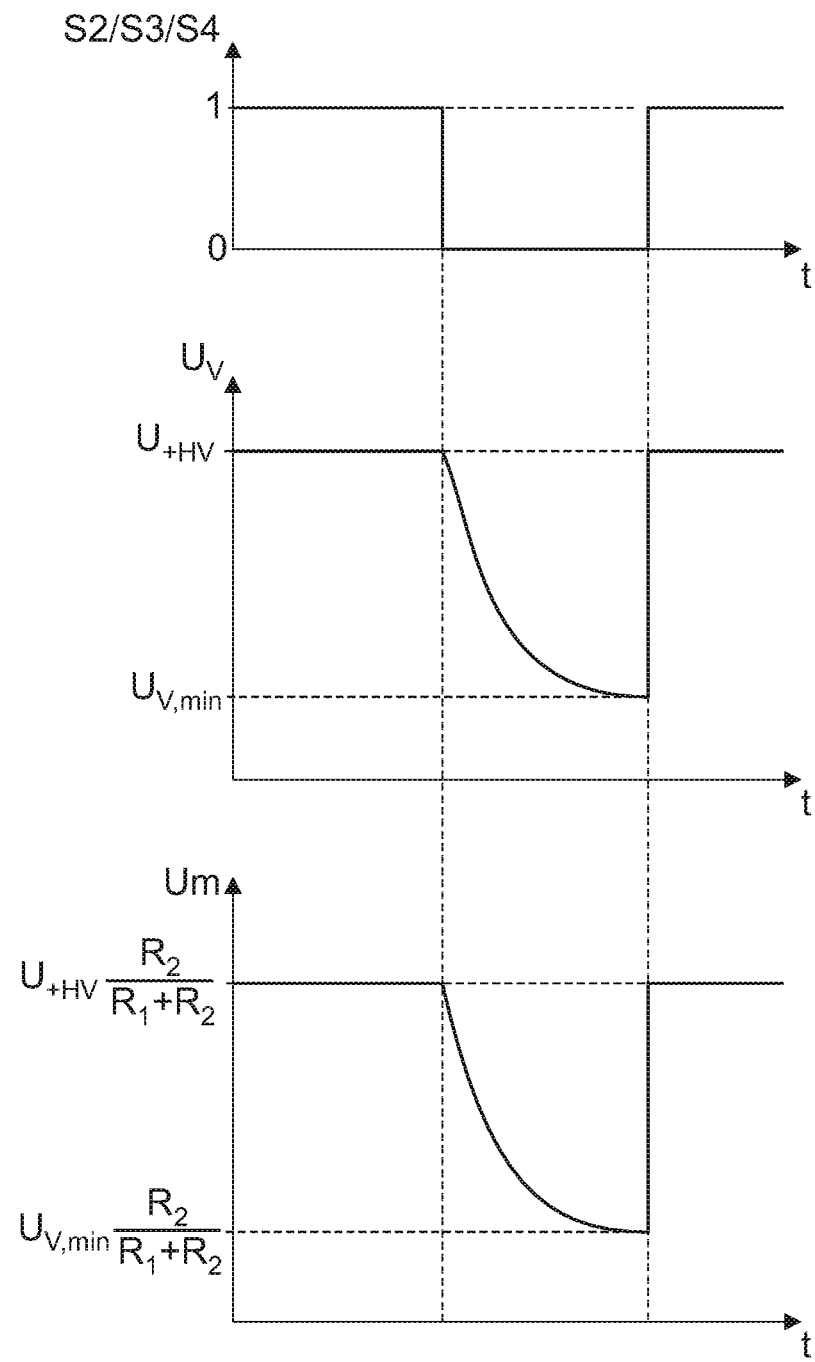
FIG. 4 is an illustration of graphs showing the control signals of the inverter, the motor phase voltage and the captured divided motor phase voltage of the insulation fault detection for the drive circuit from FIG. 2 during the positive half-wave of the network voltage in the event of an insulation fault on one of the motor phases.

FIG. 4 shows the curve profiles of the control signals S2 . . . 4 of the inverter 16, the motor phase voltage Uv and the captured divided motor phase voltage Um during the insulation fault detection for the case of an existing insulation fault, for example on the motor phase V of the motor arrangement 12, 18, during the positive half-wave of the network voltage $U_{Netz}$.

If there is an insulation fault on the motor phase V, for example, the discharge path of the parasitic capacitances C2, C3, C4 no longer leads via the high-impedance voltage divider R1, R2 of the detection circuit 30, but rather via the insulation fault resistance R7b which has a comparatively much lower resistance. For this reason, the voltage on the motor phase V now falls much more quickly during the time in which the positive transistors M2, M3, M4 are also switched off than in the fault-free case. The analogue/digital converter of the control device 32 evaluates the divided measurement signal Um of the motor phase voltage Uv and detects, on the basis of the voltage profile, whether there is an insulation fault on one of the motor phases U, V, W or at the neutral point SP.

Figure 5:
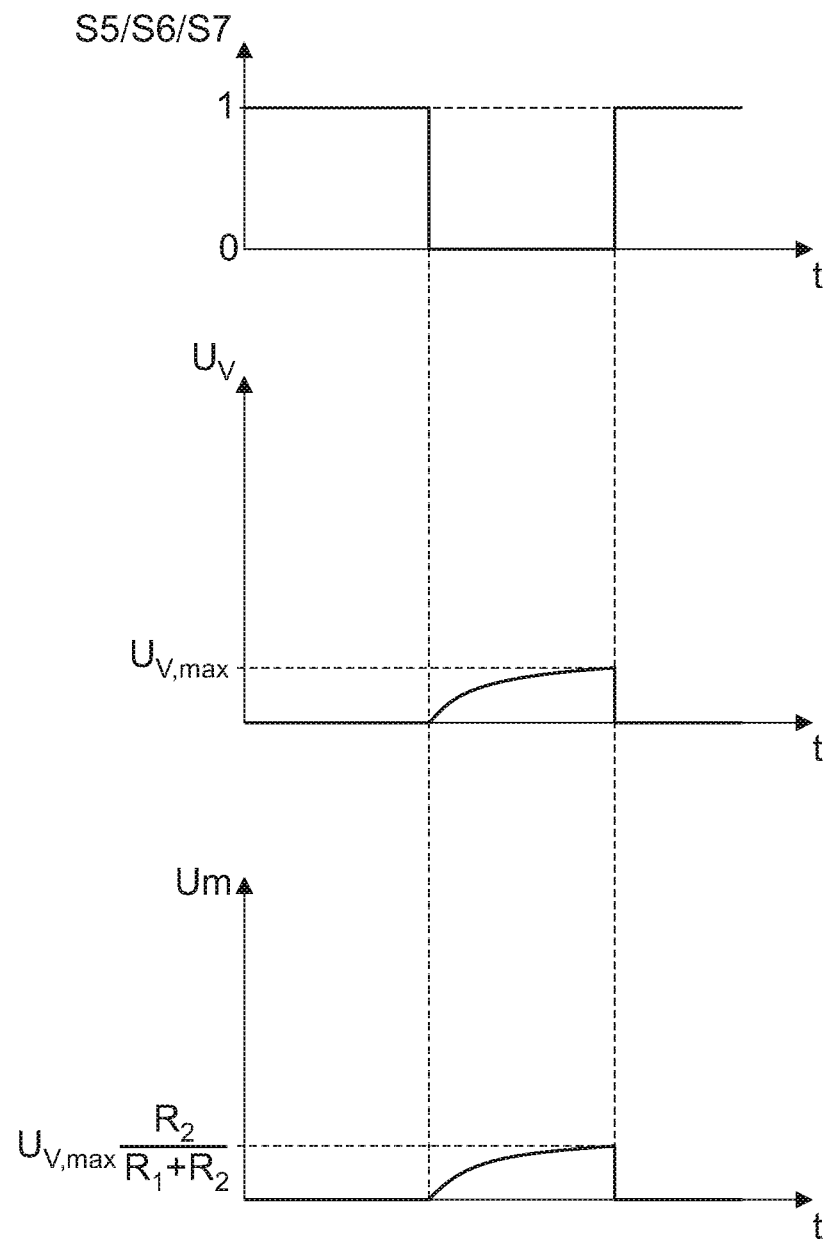
FIG. 5 is an illustration of showing the control signals of the inverter, the motor phase voltage and the captured divided motor phase voltage of the insulation fault detection for the drive circuit from FIG. 2 during a negative half-wave of the network voltage in the fault-free case without insulation faults.

FIG. 5 shows the curve profiles of the control signals S5 . . . 7 of the inverter 16, the motor phase voltage Uv and the captured divided motor phase voltage Um during the insulation fault detection for the fault-free case during the negative half-wave of the network voltage $U_{Netz}$.

After the discharging operation, all transistors M2 to M7 are switched off by the control device 32. In the fault-free case, the parasitic capacitances C2, C3, C4 are then charged via the high-impedance voltage divider R1, R2 of the detection circuit 30. As a result of the high RC time constant on account of the high impedance discharge resistor, the voltage on the motor phase V changes only very slowly during the time in which the transistors M2, M3, M4 are also switched off.

Figure 6:
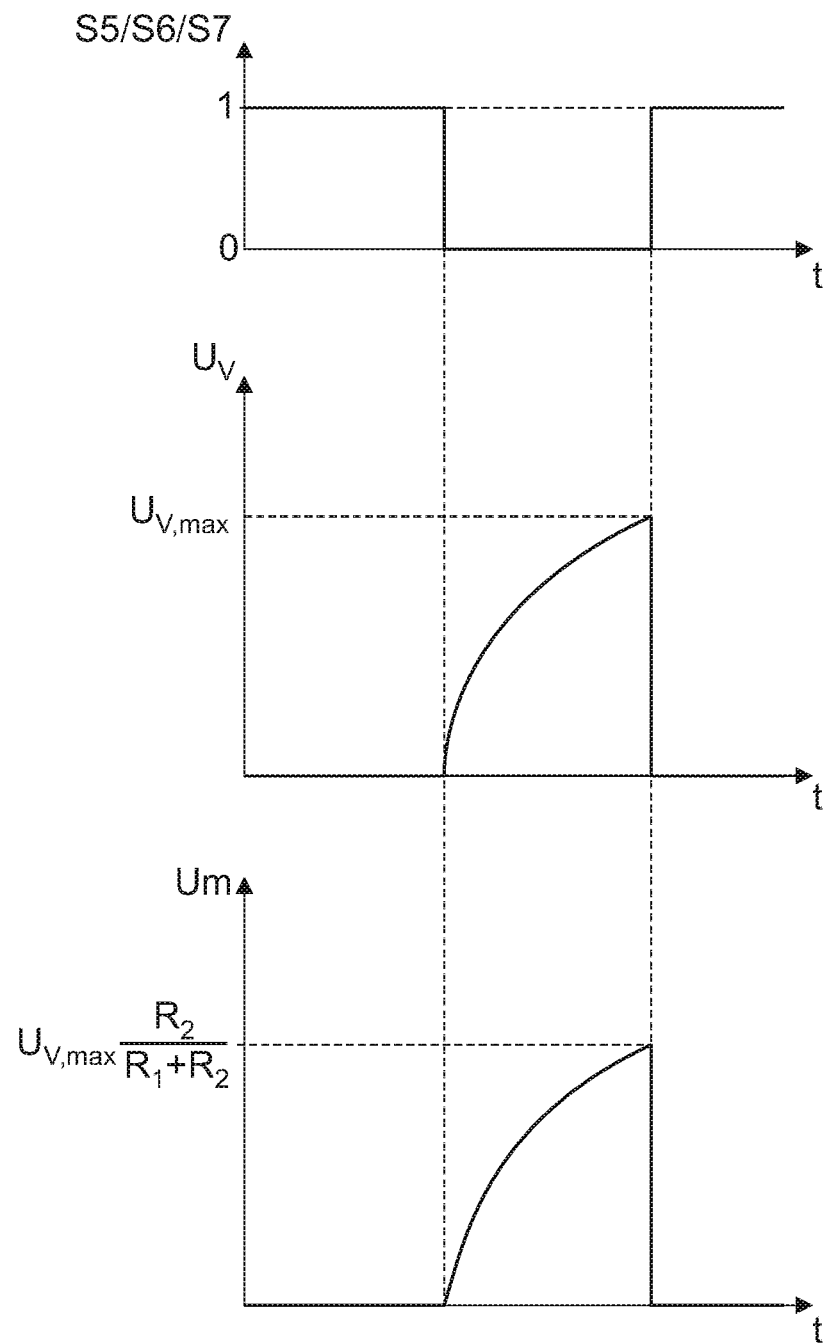
FIG. 6 is an illustration of graphs showing the control signals of the inverter, the motor phase voltage and the captured divided motor phase voltage of the insulation fault detection for the drive circuit from FIG. 2 during the negative half-wave of the network voltage in the event of an insulation fault on one of the motor phases.

FIG. 6 shows the curve profiles of the control signals S5 . . . 7 of the inverter 16, the motor phase voltage Uv and the captured divided motor phase voltage Um during the insulation fault detection for the case of an existing insulation fault, for example on the motor phase V of the motor arrangement 12, 18, during the negative half-wave of the network voltage $U_{Netz}$.

If there is an insulation fault on the motor phase V, for example, the charge path of the parasitic capacitances C2, C3, C4 no longer leads via the high-impedance voltage divider R1, R2 of the detection circuit 30, but rather via the insulation fault resistance R7b which has a comparatively much lower resistance. For this reason, the voltage on the motor phase V now rises much more quickly during the time in which the positive transistors M2, M3, M4 are also switched off than in the fault-free case. The analogue/digital converter of the control device 32 evaluates the divided measurement signal Um of the motor phase voltage Uv and can detect, on the basis of the voltage profile, whether there is an insulation fault on one of the motor phases U, V, W or at the neutral point SP.

Since the magnitude of the parasitic capacitances C2, C3, C4 is greatly dependent on the application, the parasitic capacitances can be increased, in motor structures of particularly low capacitance (for example short motor cable 18, low-capacitance motor 12), by means of additional capacitors in the drive circuit 10 which are each connected to earth from a motor phase U, V, W. The described principle of fault current detection on the motor side can therefore also be used in applications with low-capacitance motor arrangements.

In the positive half-wave of the network voltage $U_{Netz}$, the insulation fault resistance R7b can be calculated by means of the following expression:

$$R7b = -\frac{t}{C_{2,3,4} * \ln\left(\frac{\frac{R1+R2}{R2} * Um(t)}{U_{+HV}}\right)}$$

where t is the time, $C_{2,3,4}$ is the total capacitance of the three parasitic capacitances C2, C3, C4, and $U_{+HV}$ is the intermediate circuit voltage across the DC voltage intermediate circuit 14.

The maximum insulation fault current which flows at the voltage maximum of the positive half-wave of the network voltage can be calculated as follows from the insulation fault resistance R7b determined in this manner:

$$I_{R7,max} = \frac{U_{+HV}}{R7b} = \frac{U_{+HV} * C_{2,3,4} * \ln\left(\frac{\frac{R1+R2}{R2} * Um(t)}{U_{+HV}}\right)}{t}$$

The maximum fault current is the greatest possible fault current which flows during normal motor operation with the inverter switched on if there is an insulation fault with respect to protective earth on a motor phase or an insulation fault from the motor neutral point to protective earth and the zero vector (all motor phases simultaneously switched to high) is switched (the neutral point assumes the intermediate circuit voltage only in this case).

In the negative half-wave of the network voltage $U_{Netz}$, the insulation fault resistance R7b can be calculated by means of the following expression:

$$R7b = -\frac{t}{C_{2,3,4} * \ln\left(\frac{U_{Netz}(t) - \frac{R1+R2}{R2} * Um(t)}{U_{Netz}}\right)}$$

where t is the time, $C_{2,3,4}$ is the total capacitance of the three parasitic capacitances C2, C3, C4, and $U_{Netz}$ is the network voltage.

The maximum insulation fault current which flows at the voltage maximum of the negative half-wave of the network voltage can be calculated as follows from the insulation fault resistance R7b determined in this manner:

$$I_{R7,max} = \frac{U_{+HV}}{R7b} = \frac{U_{+HV} * C_{2,3,4} * \ln\left(\frac{U_{Netz}(t) - \frac{R1+R2}{R2} * Um(t)}{U_{Netz}}\right)}{t}$$

The drive circuit 10 having the detection circuit 30 according to the invention for detecting an insulation fault on the side of the motor arrangement 12, 18 can also be used in combination with other supply networks 26 and accordingly adapted rectifiers 22.

The concept described on the basis of FIGS. 1 to 6 can additionally also be used to detect motor phase interruptions which can occur, for example, as a result of a severed motor cable, a defective motor cable, an incorrectly connected motor cable or a burnt-out motor winding of the motor.

In order to detect a motor phase interruption, the control device 32 uses appropriate control signals S2 . . . 7 to switch on one of the three positive transistors M2, M3, M4 of the inverter 16 during the positive half-wave of the network voltage $U_{Netz}$, while the three negative transistors M5, M6, M7 remain permanently switched off, or the control device 32 uses appropriate control signals S2 . . . 7 to switch on one of the negative transistors M5, M6, M7 during the negative half-wave of the network voltage $U_{Netz}$, while the three positive transistors M2, M3, M4 remain permanently switched off. If the motor phase interruption detection is used in a drive circuit 10 with an active PFC filter 28, this active PFC filter 28 is preferably switched off by the control device 32 using an appropriate control signal S1.

In the fault-free state without a motor phase interruption, the motor phase voltage Uv behaves as described above. In contrast, if there is an interruption in the motor phase U, V or W, to which the switched-on circuit breaker M2 . . . 7 of the inverter 16 is assigned, the motor phase voltage Uv of the selected motor phase does not assume the intermediate circuit voltage $U_{+HV}$ (positive half-wave of the network voltage) or does not assume 0 volts (negative half-wave or the network voltage).

All positive or negative transistors M2 to M7 of the inverter 16 are preferably individually switched on in succession and the voltage profile of the selected motor phase voltage Uv is then evaluated in order to examine all existing motor phases U, V, W for a possible interruption.

The following is a summary list of reference numerals and the corresponding structure used in the above description of the invention:

10 Drive circuit
12 Motor
14 DC voltage intermediate circuit
16 Inverter
18 Motor cable
20 Motor phase connection
22 Rectifier
24 AC connection
26 Supply network
28 Power factor correction filter (PFC filter)
30 Detection circuit
32 Control device
C1 Intermediate circuit capacitor of 14
C2-C4 Parasitic capacitances on motor and motor cable
D1 Rectifier diode of 28
D7-D10 Rectifier diodes of 22
L Phase conductor of 26
L1 Inductance of 28
M1 Switch transistor of 28
M2-M7 transistors of 16
N Neutral conductor of 26
PE Protective earthing
PR Reference potential
R1, R2 Resistors of 30
R7 Insulation fault resistance
R7a-R7d Insulation fault resistances
SP Neutral point of 12
U, V, W Phases of 12, 16, 18
$I_{R7}$ Fault current
S1 Control signal for M1
S2-S7 Control signals for M2-M7
$U_{+HV}$ Intermediate circuit voltage
Um Voltage captured by 30
$U_{Netz}$ Network voltage
Uu, Uv, Uw Motor phase voltage

The invention claimed is:

1. A method for detecting an insulation fault in a motor configuration, motor phases of the motor configuration are connected to a drive circuit, the drive circuit including a DC voltage intermediate circuit and an inverter having a bridge circuit with transistors including at least one positive transistor and at least one negative transistor, which comprises the steps of:
    switching on the at least one positive or the at least one negative transistor of the inverter, while all other ones of the transistors of the inverter are switched off;
    switching off all the transistors of the inverter;
    capturing a motor phase voltage of at least one selected motor phase of the motor phases with respect to a reference potential, while all the transistors of the inverter remain switched off; and
    determining whether there is the insulation fault on one of the motor phases of the motor configuration on a basis of a voltage profile of the motor phase voltage captured.

2. The method according to claim 1, which further comprises:
    connecting the selected motor phase to the reference potential via a high-value measuring impedance; and
    capturing a divided motor phase voltage of the selected motor phase.

3. The method according to claim 2, which further comprises capturing the motor phase voltage or the divided motor phase voltage by means of a voltage divider.

4. The method according to claim 1, wherein the DC voltage intermediate circuit of the drive circuit is connected to an AC connection on an input side via a rectifier, and the drive circuit further has a power factor correction filter with a switch between the rectifier and the DC voltage intermediate circuit, which further comprises:
    switching off the switch of the power factor correction filter before switching on the at least one positive transistor or the at least one negative transistor of the inverter.

5. A method for detecting a motor phase interruption in a motor configuration, motor phases of motor configuration are connected to a drive circuit, the drive circuit containing a DC voltage intermediate circuit and an inverter having a bridge circuit with transistors including at least one positive transistor and at least one negative transistor, which comprises the steps of:
    switching on the at least one positive transistor or the at least one negative transistor of the inverter, while all other ones of the transistors of the inverter are switched off;
    capturing a motor phase voltage of at least one selected motor phase of the motor phases with respect to a reference potential; and
    determining whether there is a motor phase interruption in one of the motor phases of the motor configuration on a basis of a voltage profile of the motor phase voltage captured.

6. The method according to claim 5, which further comprises:
    connecting the selected motor phase to the reference potential via a high-value measuring impedance; and
    capturing a divided motor phase voltage of the selected motor phase.

7. The method according to claim 6, which further comprises capturing the motor phase voltage or the divided motor phase voltage by means of a voltage divider.

8. The method according to claim 5, wherein the DC voltage intermediate circuit of the drive circuit is connected to an AC connection on an input side via a rectifier, and the drive circuit further has a power factor correction filter with a switch between the rectifier and the DC voltage intermediate circuit, which further comprises:
    switching off the switch of the power factor correction filter before switching on the at least one positive transistor or the at least one negative transistor of the inverter.

9. A drive circuit for driving an electronically commutated motor, the drive circuit comprising:
    a DC voltage intermediate circuit;
    an inverter connected to said DC voltage intermediate circuit and having a bridge circuit with transistors including at least one positive transistor and at least one negative transistor, and to said transistors motor phases of a motor configuration containing the electronically commutated motor can be connected;
    a detection circuit for capturing a motor phase voltage of at least one selected motor phase of the motor phases with respect to a reference potential;
    a controller configured to individually switch said transistors of said inverter on and off and to operate said detection circuit for capturing the motor phase voltage; and
    said controller configured to determine, on a basis of a voltage profile of the motor phase voltage captured, whether there is an insulation fault on one of the motor phases of the motor configuration and/or is configured to determine, on a basis of the voltage profile of the motor phase voltage, whether there is a motor phase interruption in one of the motor phases of the motor configuration.

10. The drive circuit according to claim 9, wherein said detection circuit has a high impedance measuring via which the selected motor phase is connected to the reference potential.

11. The drive circuit according to claim 9, wherein said detection circuit has a voltage divider for capturing the motor phase voltage.

12. The drive circuit according to claim 9, wherein said drive circuit further has at least one additional capacitor which is connected to earth from one of the motor phases.

13. The drive circuit according to claim 9,
further comprising an AC connection;
further comprising a rectifier;
wherein said DC voltage intermediate circuit has an input side, said DC voltage intermediate circuit is connected to said AC connection on said input side via said rectifier;
further comprising a power factor correction filter having a switch connected between said rectifier and said DC voltage intermediate circuit; and
wherein said controller is configured to switch off said switch of said power factor correction filter before switching on said at least one positive transistor or said at least one negative transistor of said inverter.

14. The drive circuit according to claim 13, wherein said controller is configured to prevent switching-on of said inverter and/or of said power factor correction filter after capturing the motor phase voltage if the insulation fault or the motor phase interruption has been determined.

* * * * *